(12) United States Patent
Liu et al.

(10) Patent No.: US 7,883,917 B2
(45) Date of Patent: Feb. 8, 2011

(54) SEMICONDUCTOR DEVICE WITH BONDING PAD

(75) Inventors: Ming-Chyi Liu, Hsinchu (TW);
Yuan-Hung Liu, Hsinchu (TW);
Gwo-Yuh Shiau, Hsinchu (TW);
Yuan-Chih Hsieh, Hsinchu (TW);
Chi-Hsin Lo, Hsinchu County (TW);
Chia-Shiung Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/354,171

(22) Filed: Jan. 15, 2009

(65) Prior Publication Data

US 2009/0124073 A1 May 14, 2009

Related U.S. Application Data

(63) Continuation of application No. 11/696,296, filed on Apr. 4, 2007, now abandoned.

(51) Int. Cl.
*H01L 21/00* (2006.01)

(52) U.S. Cl. .................. 438/48; 257/447; 257/460; 257/E23.068

(58) Field of Classification Search .................. 257/447, 257/460, E23.068; 438/48
See application file for complete search history.

(56) References Cited

U.S. PATENT DOCUMENTS

| | | | |
|---|---|---|---|
| 5,956,569 A | 9/1999 | Shiu et al. | |
| 6,251,724 B1 | 6/2001 | Ku et al. | |
| 6,297,563 B1 * | 10/2001 | Yamaha | 257/781 |
| 6,921,976 B2 * | 7/2005 | Yamashita | 257/758 |
| 6,943,442 B2 * | 9/2005 | Sunohara et al. | 257/700 |
| 7,161,222 B2 * | 1/2007 | Kobayashi et al. | 257/460 |
| 2001/0030332 A1 * | 10/2001 | Asada et al. | 257/225 |
| 2002/0030277 A1 * | 3/2002 | Chu et al. | 257/758 |
| 2004/0014308 A1 | 1/2004 | Kellar et al. | |
| 2005/0001318 A1 | 1/2005 | Won | |
| 2005/0090035 A1 * | 4/2005 | Kim | 438/70 |
| 2005/0176174 A1 | 8/2005 | Leedy | |

(Continued)

FOREIGN PATENT DOCUMENTS

CN 1656611 8/2005

OTHER PUBLICATIONS

Chinese language office action May 8, 2009.

(Continued)

*Primary Examiner*—Ajay K Arora
(74) *Attorney, Agent, or Firm*—Thomas, Kayden, Horstemeyer & Risley

(57) ABSTRACT

A method for forming a semiconductor device with a bonding pad is disclosed. A first substrate having a device area and a bonding area is provided, wherein the first substrate has an upper surface and a bottom surface. Semiconductor elements are formed on the upper surface of the first substrate in the device area. A first inter-metal dielectric layer is formed on the upper surface of the substrate in the bonding area. A lowermost metal pattern is formed in the first inter-metal dielectric layer, wherein the lowermost metal pattern serves as the bonding pad. An opening through the first substrate is formed to expose the lowermost metal pattern.

8 Claims, 8 Drawing Sheets

U.S. PATENT DOCUMENTS

| | | | |
|---|---|---|---|
| 2005/0230847 A1* | 10/2005 | Lee et al. | 257/782 |
| 2006/0180938 A1* | 8/2006 | Kurihara et al. | 257/773 |
| 2006/0202348 A1* | 9/2006 | Kameyama et al. | 257/774 |
| 2007/0052053 A1 | 3/2007 | Lee | |
| 2007/0123021 A1* | 5/2007 | Su et al. | 438/612 |

OTHER PUBLICATIONS

English language translation of abstract of CN 1656611 (published Aug. 17, 2005).

* cited by examiner

SEMICONDUCTOR DEVICE WITH BONDING PAD

This application is a continuation of U.S. patent application Ser. No. 11/696,296, filed Apr. 4, 2007 and entitled "SEMICONDUCTOR DEVICE WITH BONDING PAD", which is hereby incorporated by reference.

BACKGROUND OF THE INVENTION

1. Field of the Invention

The invention relates to semiconductor fabrication, and more particularly to a semiconductor device such as a complementary metal-oxide-semiconductor (CMOS) image sensor with a bonding pad.

2. Description of the Related Art

Typically, a CMOS image sensor is illuminated from the front (or top) side of the silicon die. Due to processing features (metallization, polysilicon, diffusions, etc.), the pixel area is partially obscured, resulting in a loss of photons reaching the sensitive area and a reduction in the area in which photons are effectively collected. This results in a reduction of the overall sensitivity of the sensor. If photons were collected from the backside of the pixel area, these obstacles could be overcome.

Backside illumination can, however, be difficult because of the thickness of the bulk silicon and the packaging technology that allows the backside to be exposed to the illumination source. The thickness of a typical silicon wafer must be thinned considerably in order to absorb the photons in the sensitive area. Prior approaches have utilized methods for bonding the die from a bonding pad in packages. The packages provide support to the thin die while providing unobstructed ports for illumination from the backside U.S. Pat. No. 6,169,319 to Malinovich et al. disclose a method for producing a back-illuminated CMOS image sensor including a matrix of pixels (e.g., CMOS APS cells) that are fabricated on a semiconductor substrate. The semiconductor substrate is secured to a protective substrate by an adhesive such that the processed (front side) surface of the semiconductor substrate faces the protective substrate. With the protective substrate providing structural support, the exposed backside surface of the semiconductor substrate is then subjected to grinding and/or chemical etching, followed by optional chemical/mechanical processing, to thin the semiconductor substrate to a range of 10 to 15 microns. A transparent substrate (e.g., glass) is then secured to the backside surface of the semiconductor substrate, thereby sandwiching the semiconductor substrate between the transparent substrate and the protective substrate There are, however, still some problems regarding the bonding quality between the bonding pad of CMOS image sensor and the bonding wire.

BRIEF SUMMARY OF THE INVENTION

A need to develop an improved semiconductor device with a bonding pad to eliminate the aforementioned problems thus exists.

A semiconductor device such as a backside illuminated CMOS image sensor with a bonding pad is provided. The semiconductor device comprises: a first substrate having a device area and a bonding area, wherein the first substrate has an upper surface and a bottom surface; semiconductor elements disposed on the upper surface of the first substrate in the device area; a first inter-metal dielectric layer on the upper surface of the substrate in the bonding area; a lowermost metal pattern disposed in the first inter-metal dielectric layer, wherein the lowermost metal pattern serves as the bonding pad, and an opening through the first substrate exposing the lowermost metal pattern.

Another semiconductor device such as a backside illuminated CMOS image sensor with a bonding pad is provided. The semiconductor device comprises: a first substrate having a device area and a bonding area, wherein the first substrate has an upper surface and a bottom surface; semiconductor elements disposed on the upper surface in the device area; at least one inter-metal dielectric layer on the upper surface in the bonding area; an interconnect structure inlaid in the at least one inter-metal dielectric layer; an opening in the first substrate exposing the interconnect structure, and a conductive pattern disposed in the opening and connected to the interconnect structure, wherein the conductive pattern serves as the bonding pad.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
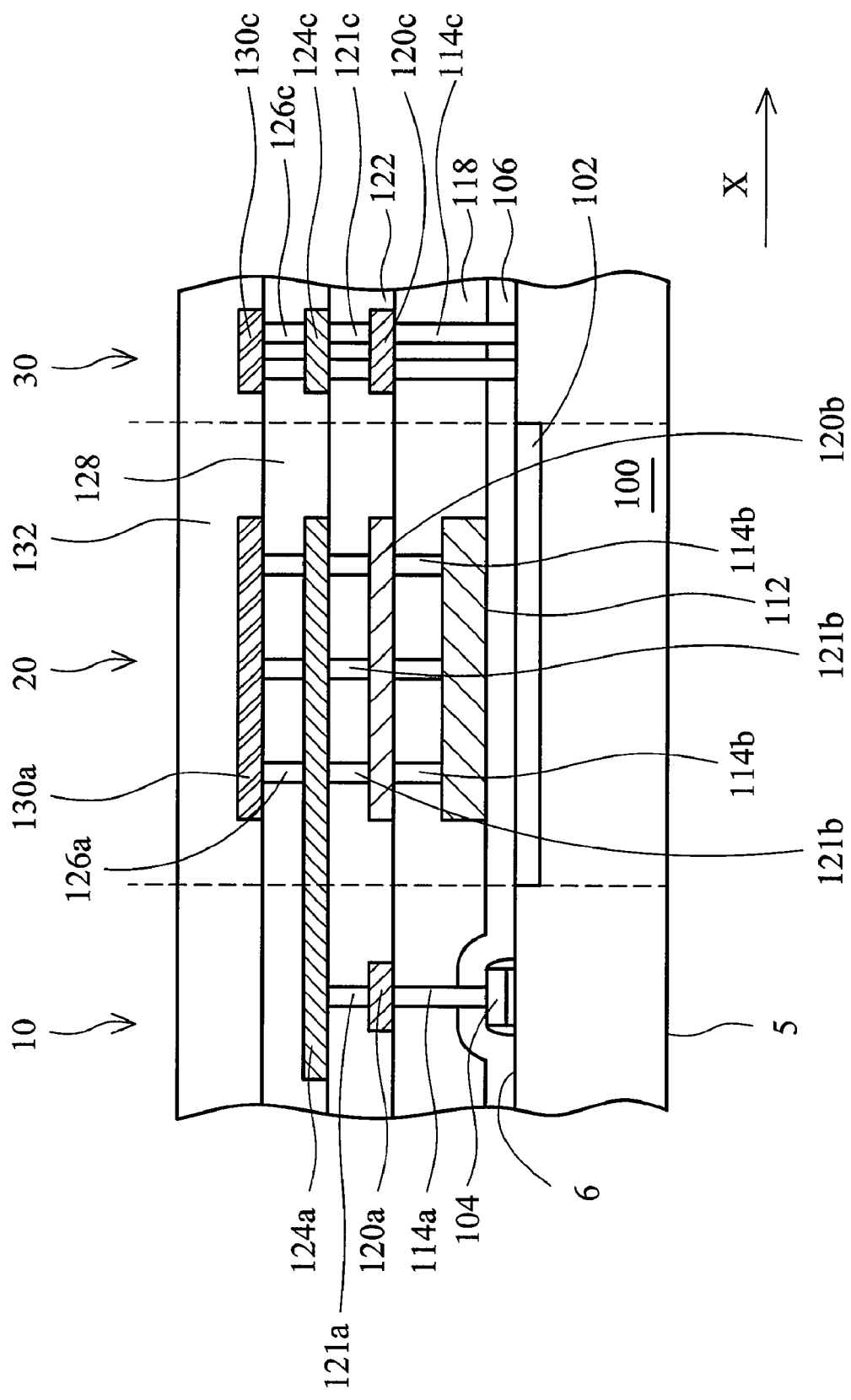
FIG. 1a is a schematic diagram showing an embodiment of a semiconductor device with a bonding pad.

As shown in FIG. 1a, a first substrate 100, a semiconductor substrate such as silicon substrate, silicon germanium substrate or silicon-on-insulator (SOI) substrate is provided. The first substrate 100 includes a device area 10, a bonding area 20 and a scribe line area 30 adjacent to the bonding area 20. The first substrate 100 has an upper surface 6 for forming integrated circuits thereon from the front side and a bottom surface 5 from the back side. The first substrate 100 may have shallow trench isolation (STI) 102 comprising silicon oxide to define the active area of the first substrate 100. Semiconductor elements 104 are disposed on the upper surface 6 of the first substrate 100 in the device area 10. The semiconductor elements 104 may comprise complementary metal-oxide-semiconductor (CMOS) image sensors including CMOS transistors, photo diodes and other integrated circuits. An insulating layer 106 such as silicon oxide, silicon nitride, silicon oxynitride, borophosphosilicate glass (BPSG), or borosilicate glass (BSG) is formed on the upper surface 6 of the first substrate 100. The insulating layer 106 covers the semiconductor elements 104, shallow trench isolation 102 and the first substrate 100 by spin coating or chemical vapor deposition (CVD) such as low pressure chemical vapor deposition (LPCVD), plasma enhanced chemical vapor deposition (PECVD), high density plasma chemical vapor deposition (HDPCVD), or atomic layer chemical vapor deposition (AL-CVD). A first inter-metal dielectric layer 118 is formed on the insulating layer 106 over the upper surface 6 of the first substrate 100 at least in the bonding area 20 by depositing a low dielectric constant material (having a k value less than 3.0) by chemical vapor deposition (CVD) such as low pressure chemical vapor deposition (LPCVD), plasma enhanced chemical vapor deposition (PECVD), high density plasma chemical vapor deposition (HDPCVD), or atomic layer chemical vapor deposition (ALCVD) or spin coating. A wide variety of low-k materials may be employed in accordance with embodiments of the invention, for example, spin-on inorganic dielectrics, spin-on organic dielectrics, porous dielectric materials, organic polymer or organic silica glass. For example, SiLK (manufactured by The Dow Chemical Co. in the U.S.A., k=2.7) or FLARE of a polyallyl ether (PAE) series material (manufactured by Honeywell Electronic Materials Co., k=2.8), Black Diamond (manufactured by Applied Materials Inc. in the U.S.A., k=3.0~2.4). FSG (SiOF series material), HSQ (hydrogen silsesquioxane, k=2.8~3.0), MSQ (methyl silsesquioxane, k=2.5~2.7), porous HSQ, porous MSQ material or porous organic series material may also be used.

A lowermost metal pattern 112, serving as the bonding pad, is disposed in the first inter-metal dielectric layer 118 in bonding area 20. A plurality of first via plugs 114b are inlaid in the first inter-metal dielectric layer 118 and on the lowermost metal pattern 112 in the bonding area 20 while the first via plug 114a and first via plugs 114c through first inter-metal dielectric layer 118 and the insulating layer 106 are formed in the device area 10 and the scribe line area 30 respectively. In one embodiment of the invention, the lowermost metal pattern 112 and the first via plugs 114a~114c are formed by a damascene technique including a series of photolithography and etching of the first inter-metal dielectric layer 118 and/or insulating layer 106 followed by electroplating a metal layer (not shown) such as copper or a alloy thereof and planarization of the metal layer by chemical mechanical polishing (CMP). In an alternative embodiment, the lowermost metal pattern 112 is formed in the insulating layer 106.

The lowermost metal pattern 112 may alternatively by formed by depositing a metal layer (not shown) such as an aluminum layer or a alloy thereof by physical vapor deposition (PVD) using a metal target followed by patterning the metal layer by photolithography and reactive ion etching (RIE) prior to formation of the first inter-metal dielectric layer 118. Next, the first via plugs 114a~114c are formed in the first inter-metal dielectric layer 118 and/or the insulating layer 106. It is noted that lowermost metal pattern 112 may be made of a titanium-free copper-aluminum alloy layer to enhance bonding quality, such as adhesion, between the bonding pad and a subsequently formed bonding wire, thus bonding wire peeling off the bonding pad can be prevented.

A second inter-metal dielectric layer 122 is formed on the lowermost metal pattern 112 and the via plugs 114a~114c. The second inter-metal dielectric layer 122 is blanketly formed, which may be formed of substantially the same materials and using substantially the same methods as the first inter-metal dielectric layer 118. An intermediate metal pattern 120b is disposed in the second inter-metal dielectric layer 122 in the bonding area 20, thus, the lowermost metal pattern 112 and the intermediate metal pattern 120b are electrically connected via plugs 114b. The intermediate metal pattern 120b may be formed of substantially the same materials and using substantially the same methods as the lowermost metal pattern 112. In the step of forming the intermediate metal pattern 120b, the intermediate metal patterns 120a and 120c may be formed simultaneously in the device area 10 and the scribe line area 30 respectively and thus comprise the same materials as the intermediate metal pattern 120b.

A plurality of second via plugs 121b are inlaid in the second inter-metal dielectric layer 122 and on the intermediate metal pattern 120b in the bonding area 20 while the second via plug 121a and second via plugs 121c through the second inter-metal dielectric layer 122 are respectively formed in the device area 10 and the scribe line area 30. The intermediate metal patterns and the via plugs in the second inter-metal dielectric layer 122 mentioned above can be formed using a damascene technique including a series of photolithography and etching of the second inter-metal dielectric layer 122 followed by electroplating a metal layer (not shown) such as copper or a alloy thereof and planarization of the metal layer by chemical mechanical polishing (CMP).

An additional inter-metal dielectric layer 128 is formed on the second inter-metal dielectric layer 122 and covering intermediate metal pattern 120b and the via plugs 121a~121c. The additional inter-metal dielectric layer 128 is blanketly formed, which may be formed of substantially the same materials and using substantially the same methods as the first inter-metal dielectric layer 118. An intermediate metal pattern 124a is disposed in the additional inter-metal dielectric layer 128 extending the bonding area 20 and the device area 10 so that the intermediate metal pattern 120b and 124a electrically connect each other through via plugs 121b. The intermediate metal pattern 124a may be formed of substantially the same materials and using substantially the same methods as the lowermost metal pattern 112. In the step of forming the intermediate metal pattern 124a, the intermediate metal patterns 124c may be formed simultaneously in the scribe line area 30 and thus comprise the same materials as the intermediate metal pattern 124a.

A plurality of third via plugs 126a and third via plugs 126c are inlaid in the additional inter-metal dielectric layer 128 in the bonding area 20 and scribe line area 30 respectively. A third inter-metal dielectric layer 132 is formed on the additional inter-metal dielectric layer 128 and covering the intermediate metal pattern 124a, the via plugs 126a and via plugs 126c. The third inter-metal dielectric layer 132 is blanketly formed, and may be formed of substantially the same materials and using substantially the same methods as the first inter-metal dielectric layer 118. An uppermost metal pattern 130a is disposed in the third inter-metal dielectric layer 132 in the bonding area 20 while the uppermost metal pattern 130c is simultaneously formed in the scribe line area 30.

A interconnect structure comprising the lowermost metal pattern, intermediate metal pattern, uppermost metal pattern and via plugs mentioned above is created. The lowermost metal pattern 112 is electrically connected to semiconductor elements 104 by the interconnect structure.

Figure 1B:
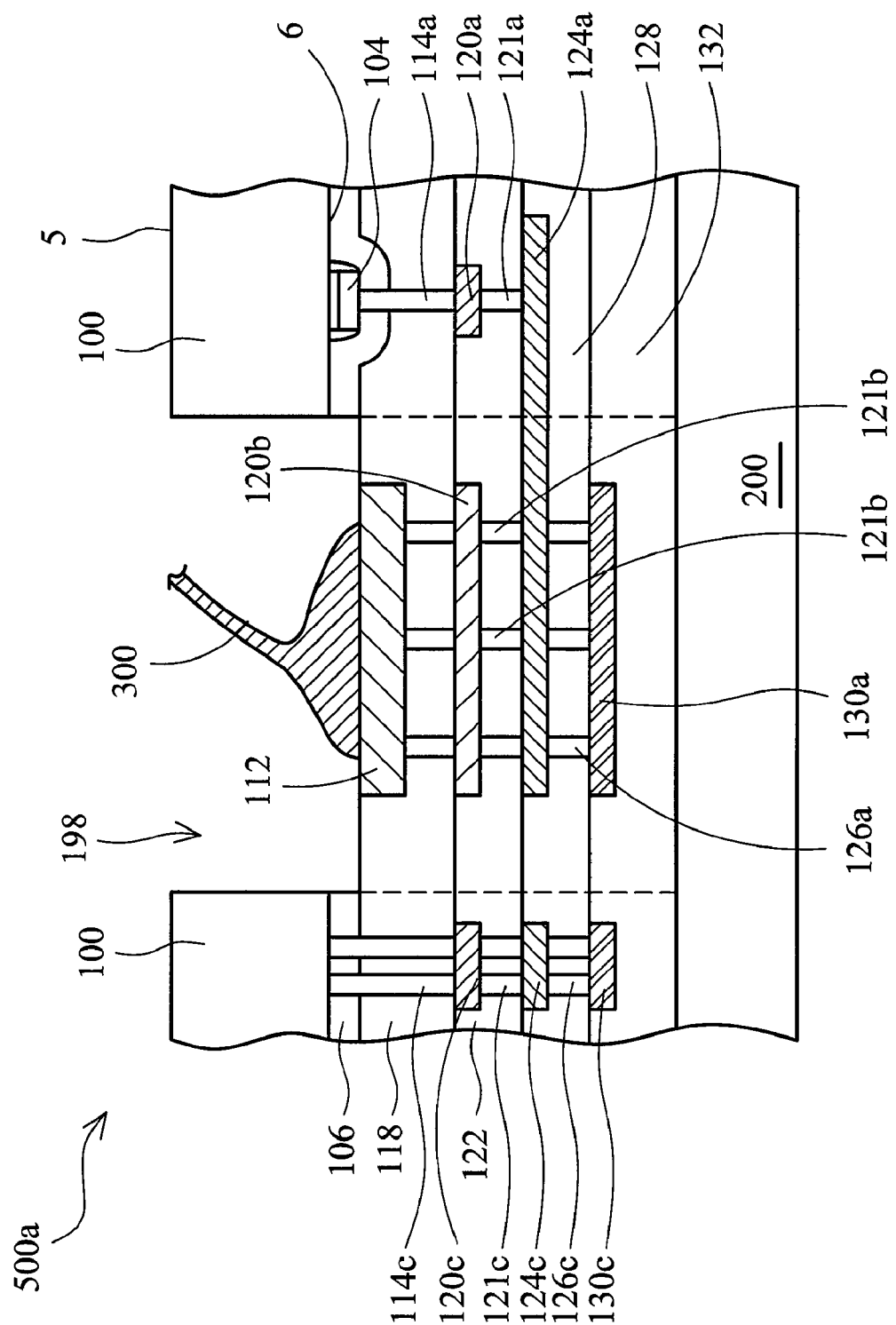
FIG. 1b is a schematic diagram showing the semiconductor device with a bonding pad of FIG. 1a and a bonding wire attached to the bonding pad.

FIG. 1b is a schematic diagram showing a semiconductor device 500a such as a backside illuminated CMOS image sensor with the lowermost metal pattern 112 serving as the bonding pad of FIG. 1a and a bonding wire attached to the bonding pad. The semiconductor device as shown in FIG. 1a is rotated 180° along the horizontal axis x so that the bottom surface 5 of the first substrate 100 faces upward. An opening 198 exposing the lowermost metal pattern 112 is formed through the first substrate 100 by etching the first substrate 100 and the shallow trench isolation 102. Before forming the opening 198, the first substrate 100 may be ground and thinned from the back side. The first inter-metal dielectric layer 118 and lowermost metal pattern 112 may be removed slightly during formation of the opening 198.

A bonding wire 300 comprising a metal such as copper, gold, nickel, titanium or an alloy thereof is attached to the lowermost metal pattern 112 through the opening 198 by a wire bonding technique. Furthermore, a second substrate 200, serving as a carrier substrate, is attached to the first substrate 100 so that the semiconductor elements 104, the lowermost metal pattern 112 and the uppermost metal pattern 130a are interposed therebetween. In an exemplary embodiment of the invention, the second substrate 200 is attached to the third inter-metal dielectric layer 132. The second substrate 200 may be made of substantially the same materials as first substrate 100. Alternatively, the second substrate 200 may comprise glass, plastic material, ceramic material or other suitable materials.

Figure 2A:
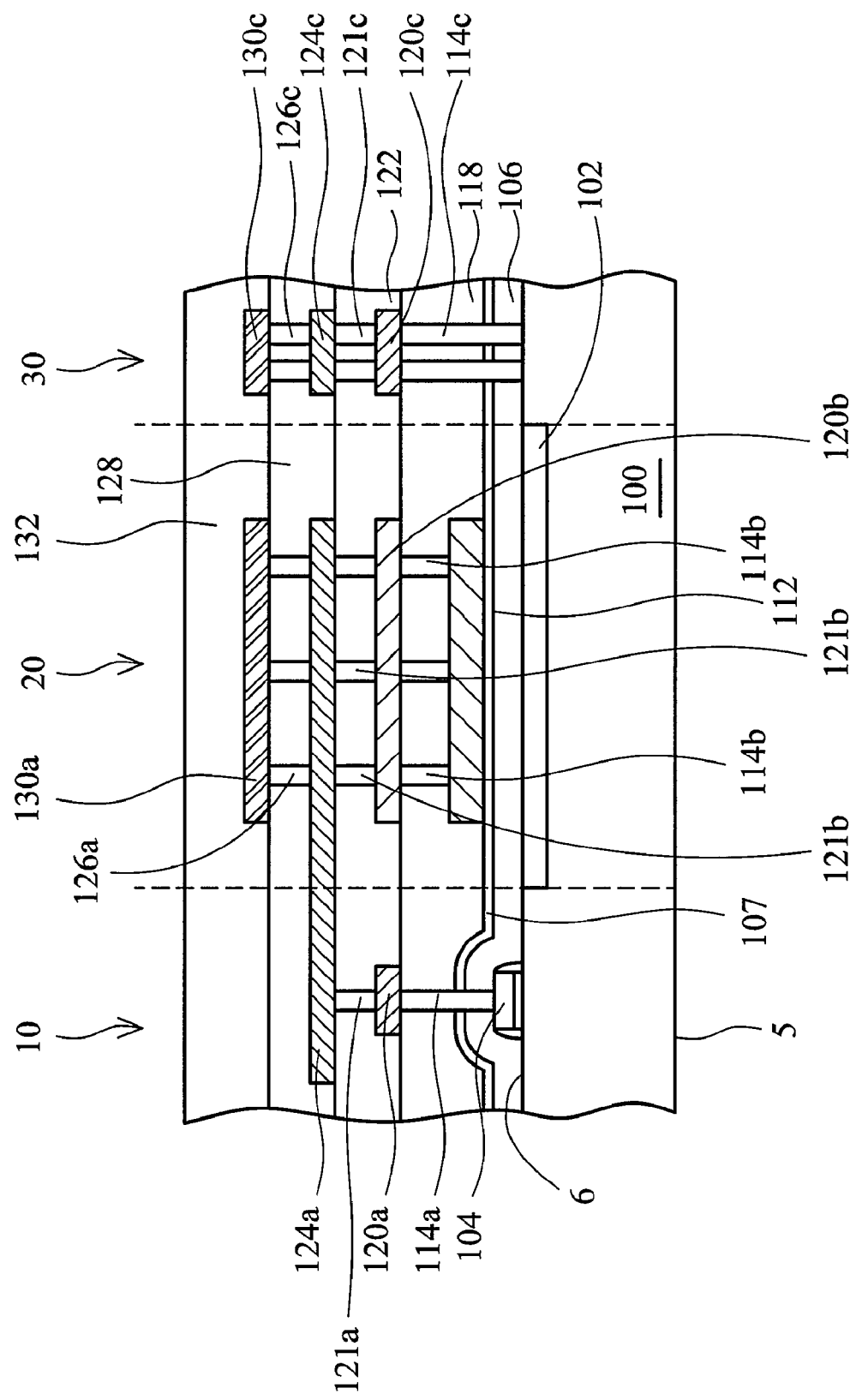
FIG. 2a is a schematic diagram showing another embodiment of a semiconductor device with a bonding pad.
Figure 2B:
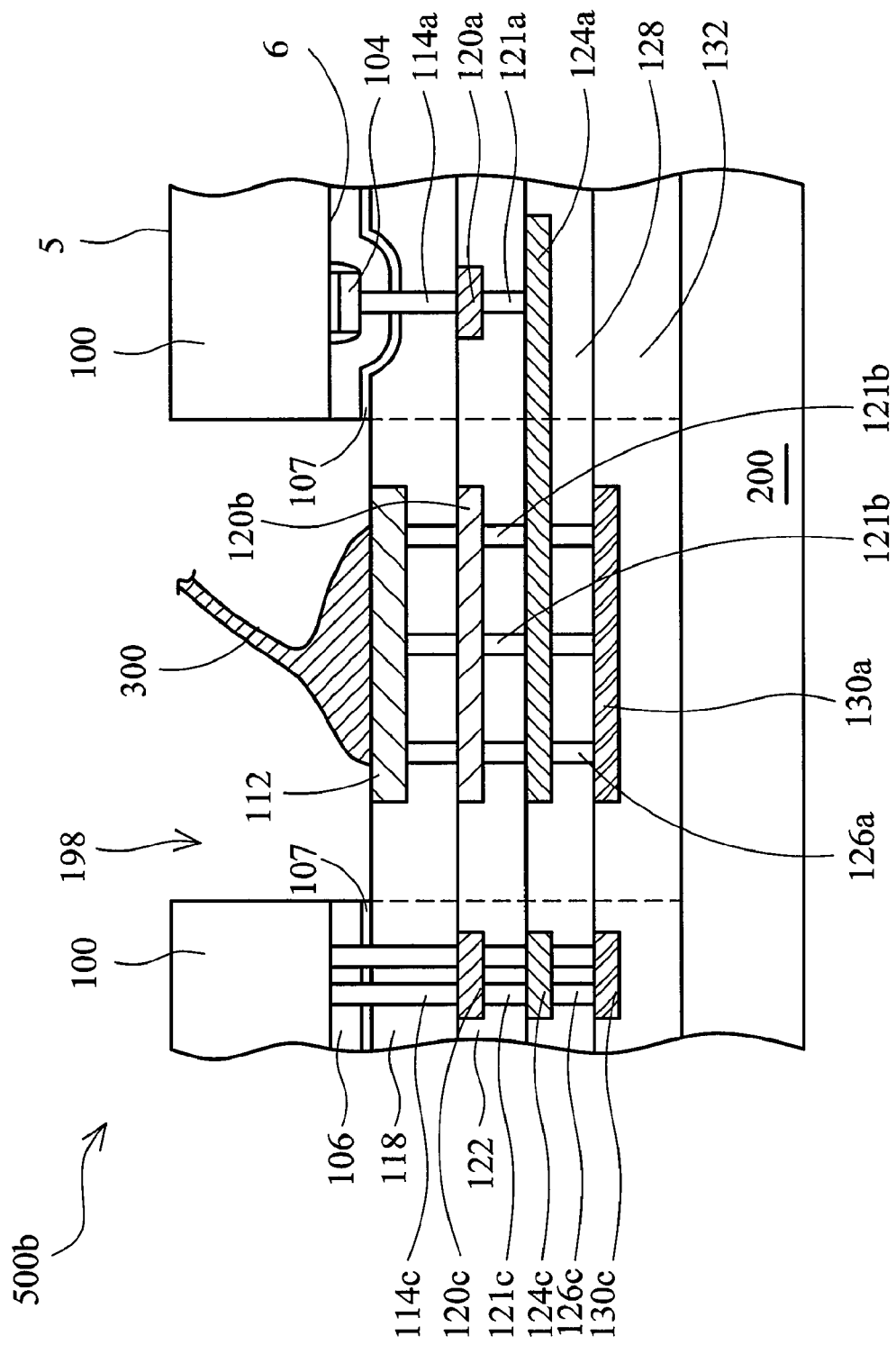
FIG. 2b is a schematic diagram showing the semiconductor device with a bonding pad of FIG. 2a and a bonding wire attached to the bonding pad.

Another embodiment of a semiconductor device with a bonding pad is shown as FIG. 2a and FIG. 2b, in which the semiconductor device 500b as shown in FIG. 2b is rotated 180° of that of FIG. 2a, thus the bottom surface 5 of the first substrate 100 faces upward and the upper surface 6 of the first substrate 100 faces downward.

The semiconductor device of FIG. 2a is substantially the same as that of FIG. 1a except that an etching stop layer 107 is formed between the lowermost metal pattern 112 and the insulating layer 106 over the upper surface 6 of the first substrate 100. The etching stop layer 107 may comprise silicon nitride, silicon oxynitride, silicon carbide or combination thereof. In one embodiment, the etching stop layer 107 may have an etching selectivity of about 2 to about 20 with respect to the insulating layer 106. The first inter-metal dielectric layer 118 and the lowermost metal pattern 112 can be protected by the etching stop layer 107 during the formation of the opening 198 by the etching step, thus over-etching of the first inter-metal dielectric layer 118 and lowermost metal pattern 112 can be prevented and adhesion quality between the bonding pad and bonding wire can further be prevented. The etching stop layer 107 is then removed from the opening 198 to expose the lowermost metal pattern 112 before forming the bonding wire 300 as shown in FIG. 2b.

Figure 3A:
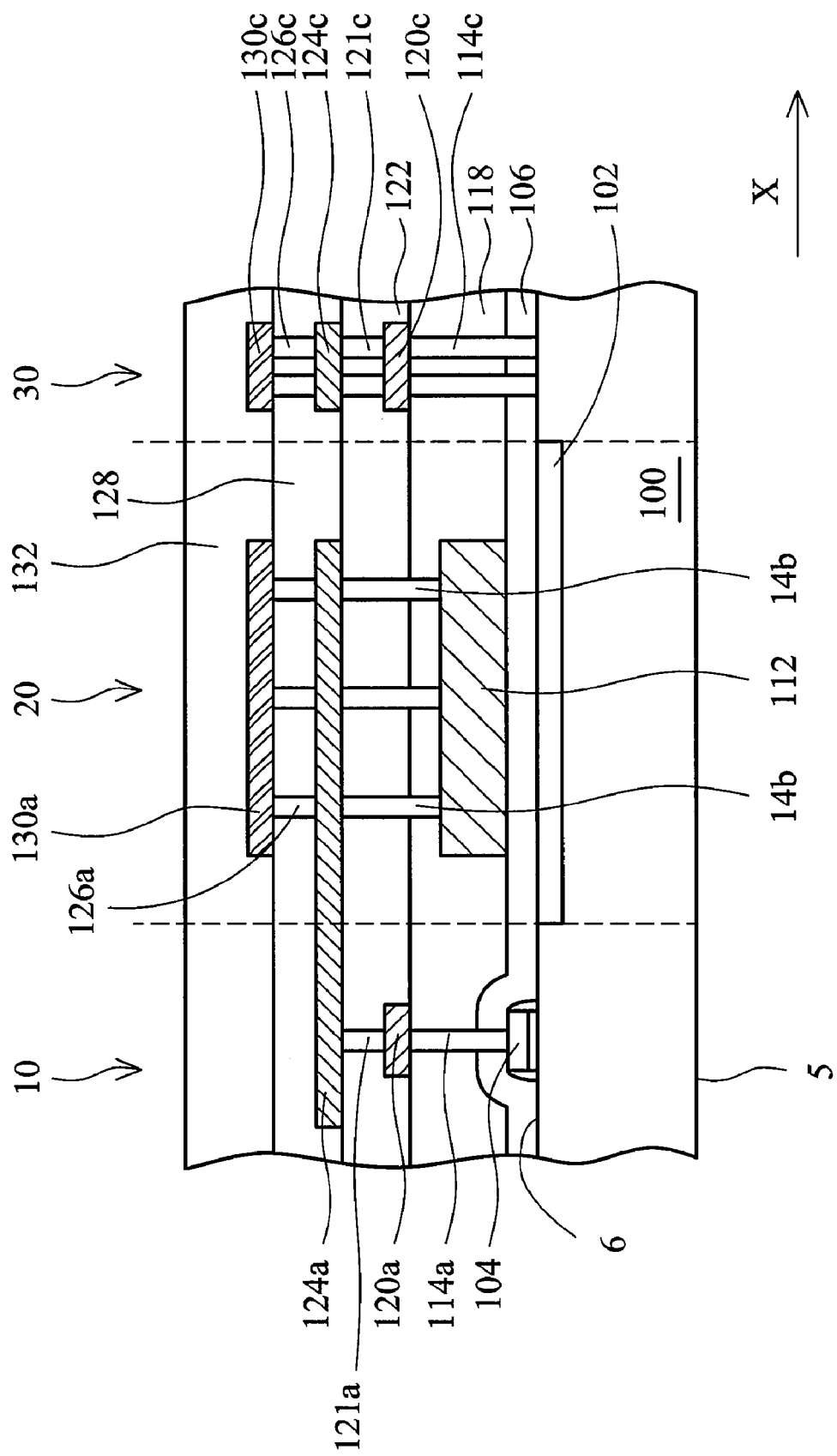
FIG. 3a is a schematic diagram showing yet another embodiment of a semiconductor device with a bonding pad.
Figure 3B:
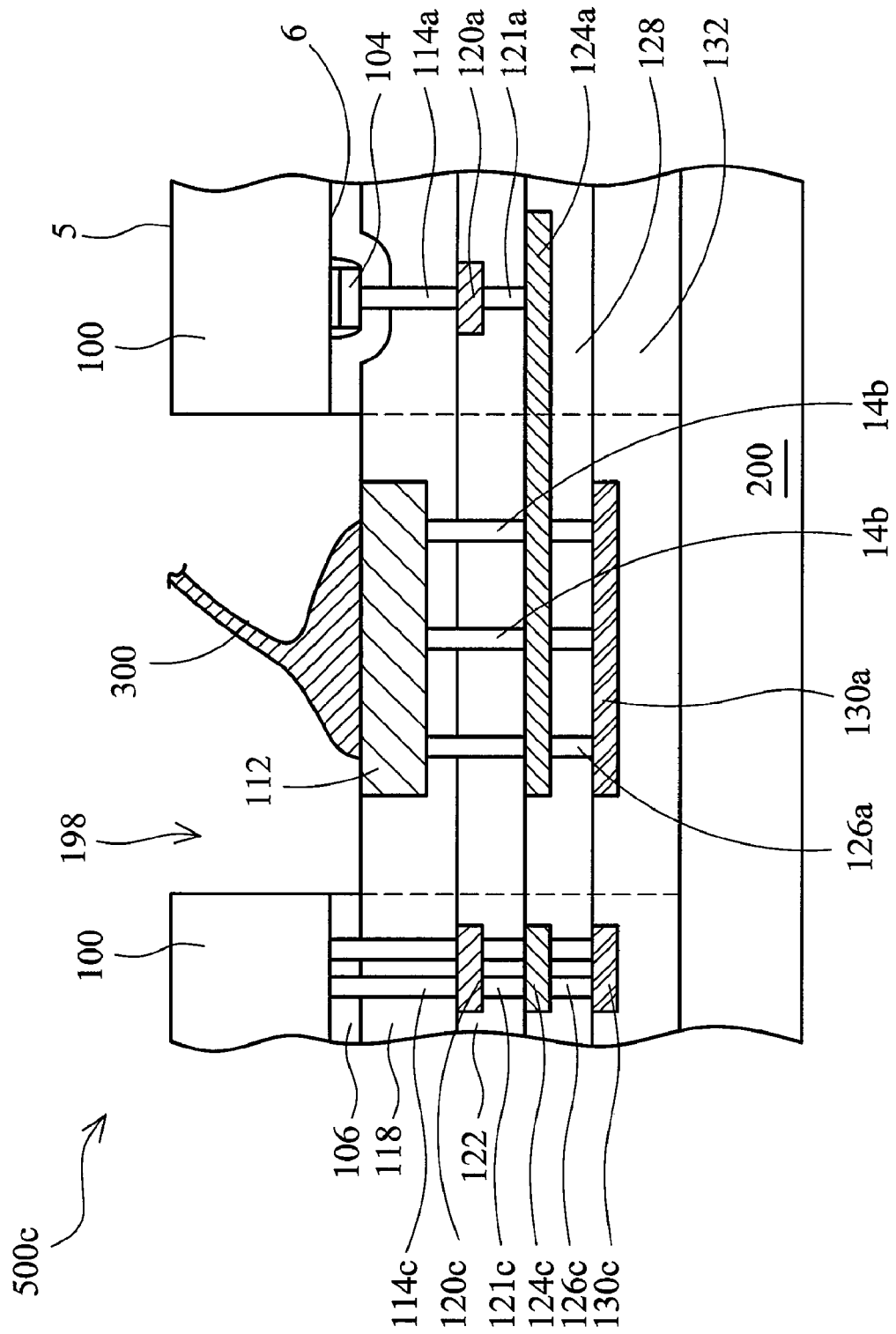
FIG. 3b is a schematic diagram showing the semiconductor device with a bonding pad of FIG. 3a and a bonding wire attached to the bonding pad.

Yet another embodiment of a semiconductor device such as a backside illuminated CMOS image sensor with a bonding pad is shown in FIG. 3a and FIG. 3b. In the figures the semiconductor device 500c as shown in FIG. 3b is rotated by 180° from that of FIG. 3a, thus the bottom surface 5 of the first substrate 100 faces upward and the upper surface 6 of the first substrate 100 faces downward. The semiconductor device of FIG. 3a is substantially the same as that of FIG. 1a except that lowermost metal pattern 112 is relatively thicker and intermediate metal pattern 120b is not formed so that the lowermost metal pattern 112 is connected to intermediate metal pattern 124a through via plugs 14b. In the exemplary semiconductor device 500c having relatively thicker lowermost metal pattern 112, adhesion quality may be ensured if the lowermost metal pattern 112 is over-etched.

Figure 4A:
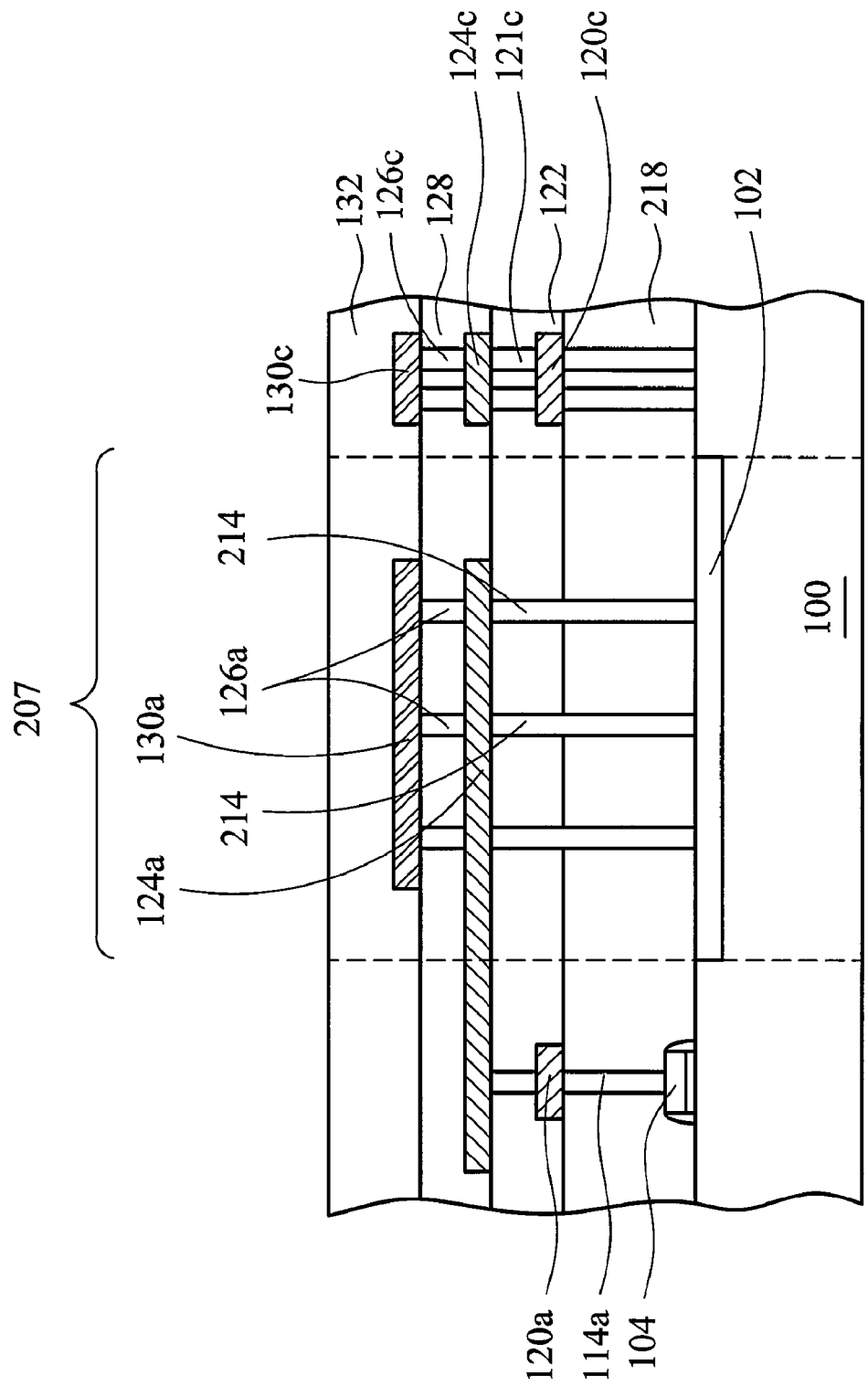
FIG. 4a is a schematic diagram showing yet another embodiment of a semiconductor device with a bonding pad.
Figure 4B:
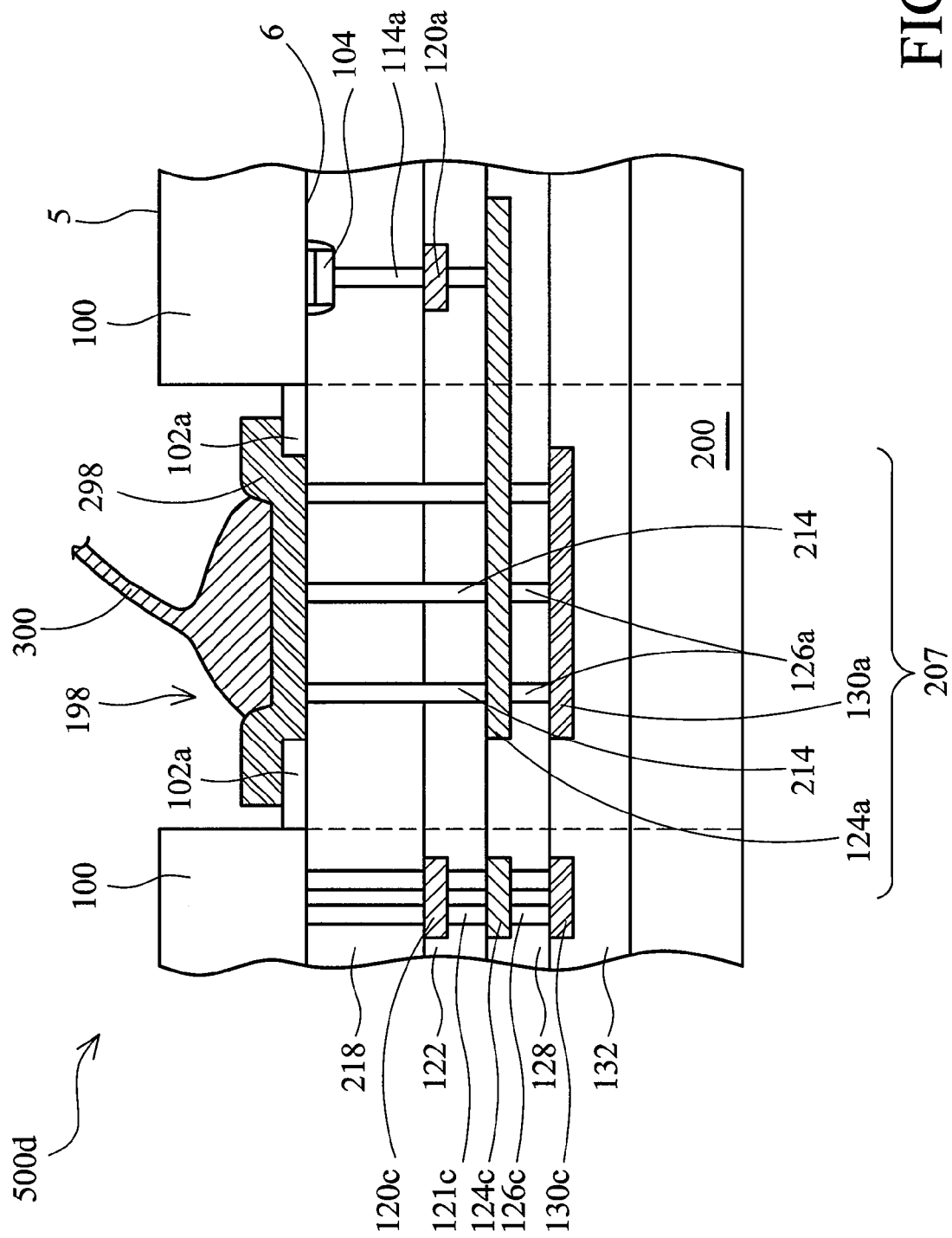
FIG. 4b is a schematic diagram showing the semiconductor device with a bonding pad of FIG. 4a and a bonding wire attached to the bonding pad.

Another embodiment of a semiconductor device such as backside illuminated CMOS image sensor with a bonding pad is shown in FIG. 4a and FIG. 4b. In the figures, semiconductor device 500d shown in FIG. 4b is by rotated 180° from that of FIG. 4a, thus the bottom surface 5 of the first substrate 100 faces upward and the upper surface 6 of the first substrate 100 faces downward. The semiconductor device of FIG. 4a is substantially the same as that of FIG. 1a except that insulating layer 106, the lowermost metal pattern 112 and the intermediate metal pattern 120b are not formed so that deeper via plugs 214 are formed through the first inter-metal dielectric layer 218 and second inter-metal dielectric layer 122. An interconnect structure 207 including via plugs 214, 126a, intermediate metal pattern 124a and uppermost metal pattern 130a is created to communicate with the semiconductor elements 104.

As shown in FIG. 4b, an opening 198 exposing the interconnect structure 207 is formed through the first substrate 100 by etching the first substrate 100 and the shallow trench isolation 102 using wet etching with an etchant containing KOH and/or HF solution. Before forming the opening 198, the first substrate 100 may be ground and thinned from the back side of the first substrate 100. In one embodiment, a part of shallow trench isolation 102a may remain after forming the opening 198. Also, a conductive pattern 298 serving as the bonding pad is formed on the interconnect structure 207 and the remaining shallow trench isolation 102a in the opening 198. The conductive pattern 298 is electrically connected to the semiconductor elements 104 by the interconnect structure 207. The conductive pattern 298 may be formed by depositing a metal layer such as copper, aluminum or an alloy thereof by physical vapor deposition (PVD) or sputtering deposition using a metal target. A patterned photoresist layer is then formed by photolithography comprising photoresist spin coating, soft baking, exposing, developing, and hard baking. The metal layer is anisotropically etched by reactive ion etching (RIE) not covered by the patterned photoresist layer to form the conductive pattern 298. In an exemplary embodiment of the invention, the conductive pattern 298 may be made of a titanium-free copper-aluminum alloy layer to enhance bonding quality, such as adhesion, between the bonding pad and a subsequently formed bonding wire. A bonding wire 300 comprising a metal such as copper, gold or an alloy thereof is then attached to the conductive pattern 298 through the opening 198 by wire bonding technique.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device with a bonding pad, the method comprising:
   providing a first substrate having an upper surface and a bottom surface, the upper surface comprising a device area and a bonding area;
   forming semiconductor device elements in the device area;
   forming a bonding pad over the upper surface of the first substrate in the bonding area;
   forming an interconnect structure comprising a plurality of inter-metal dielectric layers, via plugs and metal patterns within the inter-metal dielectric layers over the bonding pad, wherein a surface of the interconnect structure closest to the bonding pad is the bottom surface of the interconnect structure;
   bonding a top surface of the interconnect structure to a second substrate;

forming an opening from the bottom surface side through the first substrate to expose the bond pad, and attaching a wire bond passing through the opening to the exposed bond pad;

wherein the interconnect structure is disposed between the bonding pad and the second substrate.

2. The method of claim 1, further comprising a step of thinning the first substrate before the step of forming an opening through the first substrate.

3. The method of claim 1, wherein the second substrate comprises a material selected from the group of glass, plastic material, and ceramic material.

4. The method of claim 1, wherein the step of forming an opening through the first substrate comprises wet etching the first substrate with an etchant containing a KOH or HF solution.

5. The method of claim 1, wherein the via plugs and metal patterns encased within the inter-metal dielectric layers electrically connect the semiconductor elements to the bond pad.

6. The method of claim 1, further comprising a step of depositing an etch stop layer over the bonding area and the device area, wherein the etch stop layer is interposed between the upper surface of the first substrate and the interconnect structure.

7. The of claim 1, further comprising a step of forming a shallow trench isolation structure in the bonding region.

8. The of claim 1, wherein the semiconductor elements comprise CMOS image sensors.

* * * * *